United States Patent [19]

Harrison et al.

[11] 4,333,053
[45] Jun. 1, 1982

[54] IMAGING SYSTEMS

[75] Inventors: Colin G. Harrison, San Jose, Calif.; Michael Burl, Iver, England

[73] Assignee: EMI Limited, Hayes, England

[21] Appl. No.: 125,495

[22] Filed: Feb. 28, 1980

[30] Foreign Application Priority Data

Mar. 13, 1979 [GB] United Kingdom ................ 7908734

[51] Int. Cl.³ ............................................ G01N 27/00
[52] U.S. Cl. ...................................... 324/307; 324/309
[58] Field of Search ........................ 324/300, 307, 309

[56] References Cited

U.S. PATENT DOCUMENTS

| 4,015,196 | 3/1977 | Moore | 324/309 |
| 4,021,726 | 5/1977 | Garroway | 324/309 |
| 4,070,611 | 1/1978 | Ernst | 324/309 |
| 4,115,730 | 9/1978 | Mansfield | 324/309 |

Primary Examiner—Michael J. Tokar
Attorney, Agent, or Firm—Fleit & Jacobson

[57] ABSTRACT

In known NMR imaging apparatuses it has been the practice to arrange the $G_R$ field gradient, which rotates in the plane of the examined slice, with a zero crossing substantially in the center of the slice and to demodulate at the Larmor frequency at the zero crossing. It is now proposed to demodulate the detected resonance signals at a frequency which, in the presence of the field gradient, is for a part of the plane lying outside the body slice. This may be by arranging the zero-crossing to be outside the slice. In that case it is preferable that the zero-crossing of $G_R$ lies on a straight line (27) maintained tangential to a circle (28) lying outside the body (23) about an axis (24) through the slice. Control may then be by precalculated coil currents or by precalculating fields at probe positions and adjusting the coil currents to give the expected fields.

Alternatively the zero-crossing may be maintained at the center and demodulation may be at a different frequency. It is then desirable also to measure the resonance frequency in the absence of the field gradient across the slice. The resonance signals are then effectively further demodulated at that measured frequency. The effective demodulation is preferably achieved by complex multiplication of the two signals.

24 Claims, 13 Drawing Figures

IMAGING SYSTEMS

The present invention relates to systems for providing images of distributions of a quantity, in a chosen region of a body, by gyromagnetic resonance, particularly nuclear magnetic resonance (NMR) techniques. Such techniques may be used for examining bodies of different kinds. However a particularly beneficial application is the examination of patients for medical purposes.

It has been proposed that nuclear magnetic resonance be used to provide distributions of water protons or other molecules or relaxation time constants in sectional slices or volumes of patients. It is particularly beneficial to perform the examination to provide data which can be analysed by techniques similar to those known for distributions of x-ray attenuation provided by computerised tomography (CT) systems.

An apparatus for and method of achieving the examination, and improvements thereto, have been described and claimed in our co-pending patent applications Ser. Nos. 039,650, 040,289, 039,649 and 048,777 and U.S. Pat. No. 4,254,778.

Apparatus of the form described in the said applications has produced satisfactory pictures. These pictures have been found to include artefacts resulting from noise introduced by the system. In particular some artefacts have been found to appear consistently at or close to the centre of the picture.

It is an object of this invention to provide an arrangement by which such noise originating artefacts can be reduced.

It should also be noted that the prior system provides signals with double sidebands, after demodulation with a reference frequency. These sidebands must be separated. This may be achieved in the Fourier transform following phase correction. This invention allows in one embodiment an arrangement which can avoid that problem.

According to the invention there is provided a nuclear magnetic resonance apparatus, for examining a substantially planar slice of a body, the apparatus including means for applying magnetic fields to cause resonance preferentially in the plane of said slice, means for applying a pulsed magnetic field having a gradient across the plane of the slice to produce phase dispersion in said resonance, means for sensing resonance signals induced during said pulsed field for a plurality of different directions thereof, means for demodulating the resonance signals and means for further processing the demodulated signals to provide a representation of said slice, wherein the resonance signals are demodulated at a frequency which, in the presence of the said magnetic fields and pulsed magnetic field, is the resonance frequency for a position in the plane lying outside said slice.

A method of examining a substantially planar slice of a body by nuclear magnetic resonance, the method including: applying magnetic fields to cause resonance preferentially in the plane of the slice; applying a pulsed magnetic field having a gradient across the plane of the slice to produce phase dispersion in said resonance; sensing the resonance signals induced during said pulsed field for a plurality of different directions thereof; demodulating the resonance signals and further processing the demodulated signals to provide a representation of said slice; wherein the resonance signals are demodulated at a frequency which, in the presence of the said magnetic fields and pulsed magnetic field, is the resonance frequency for a position in the plane lying outside said slice.

In order that the invention may be clearly understood and readily carried into effect it will now be described with reference to the accompanying drawings, of which.

Nuclear magnetic resonance techniques are generally used to analyse distributions of protons of water molecules in a body. They can, however, be used to analyse other molecules.

Molecules subject to a magnetic field have a resonant frequency related to the value of the field. Then by application of an RF magnetic field at the resonant frequency they can be excited and the excitation allowed to decay. The decay causes an induced signal at the resonant frequency in suitable coils around the body.

In the arrangement described in the aforesaid applications the magnetic field is adjusted to have different values in different parts of the body. Only those parts having a resonant frequency equal to the frequency of the RF field are excited.

The basic magnetic field is in the z direction, usually coaxial with a patients body and can be called $H_{zo}$ if all fields in that direction are referred to as $H_z$. A further $H_z$ field $G_z$ is applied to have a gradient in the z direction so that $G_z = (\partial H_z/\partial z)$. This provides a unique total field value in a chosen cross-sectional slice of the patient. A rotating RF field $H_1$, of frequency chosen to cause resonance in the selected slice, is then applied. Thus ideally only the molecules in the slice resonate. The resonance signal from the slice can then be detected. However as it is detected there is applied a further field, $G_R = (\partial H_z/\partial r)$ which is in the z-direction but has a gradient in a direction r perpendicular to z. This causes dispersion of the resonant frequencies in the r-direction and consequent dispersion of the resonance signal detected. Frequency analysis of this signal, preferably by Fourier Transformation, yields a plurality of resonance signals each for a different one of a plurality of strips in the chosen slice perpendicular to r.

Now for analysis by CT x-ray techniques this procedure is repeated for many different directions of r to provide a plurality of sets of signals for sets of strips in different directions.

In practice $G_R$ is provided as the sum of $G_x$ ($= \partial Hz/\partial x$) and $G_y$ ($= \partial Hz/\partial y$) gradients where x, y and z are orthogonal gradients and the relative magnitudes of these components are varied to change the direction of r.

Figures 1, 2:
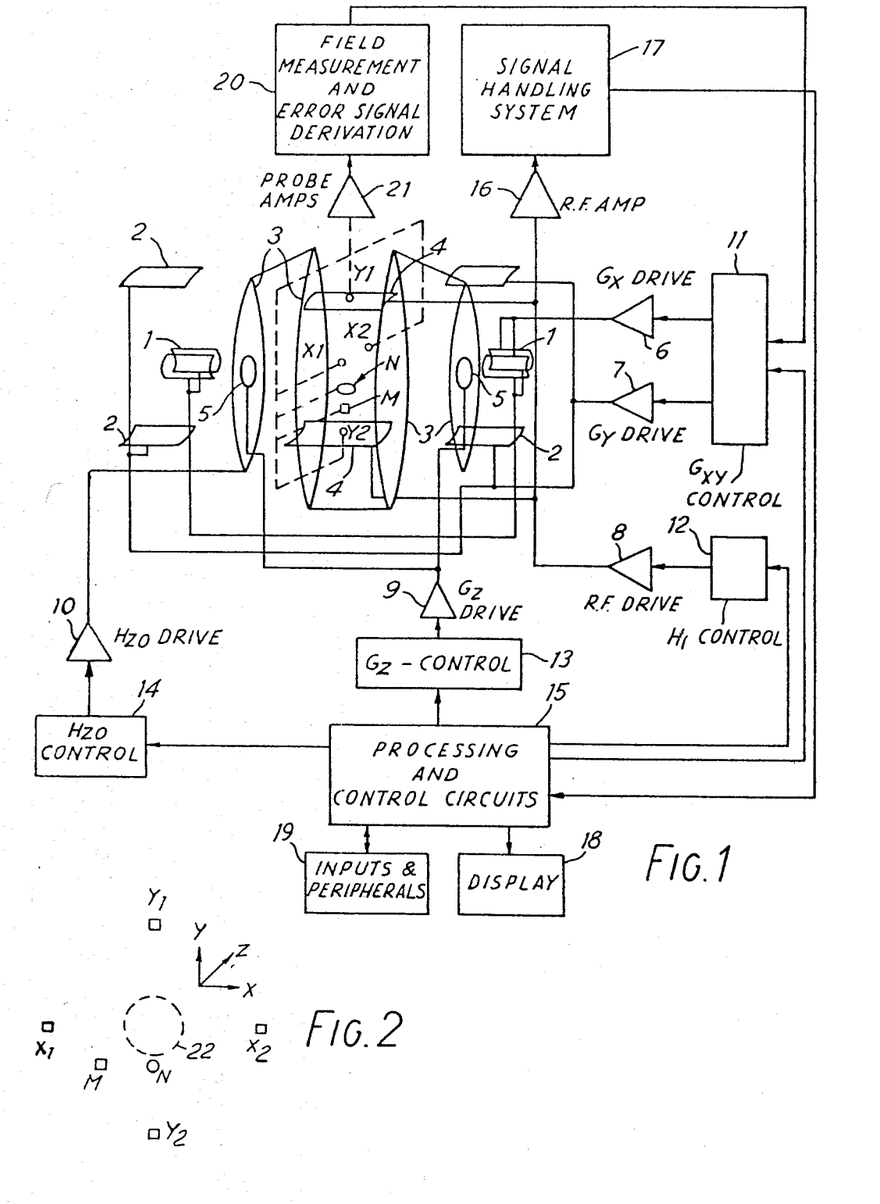
FIG. 1 shows in schematic form an NMR apparatus with which the invention may be used.
FIG. 2 shows the distribution of field measurement probes for the apparatus of FIG. 1.

FIG. 1 shows in simplified form the NMR apparatus described in the said applications. Illustrated schematically are coils 1, which provide the $G_x$ component of $G_R$; 2, which provide the $G_y$ component of $G_R$; 3, which provide the steady $H_{zo}$ field; 4, which provide the rotating $H_1$ RF field; and 5, which provide the $G_z$ field gradient. Coils 1 and 2 are opposing pairs of saddle shaped coils, probably on a common former, as shown in said application no. 7,921,183 but are shown in FIG. 1 with exaggerated spacing for improved clarity of the Figure. The coils are driven by $G_x$, $G_y$, RF ($H_1$), $G_z$ and $H_{zo}$ drive amplifiers 6, 7, 8, 9 and 10 respectively, controlled by $G_{xy}(G_R)$, $H_1$, $G_z$ and $H_{zo}$ control circuits 11, 12, 13 and 14 respectively. These circuits can take suitable forms which will be well known to those with experience of NMR equipment and other apparatus using coil induced magnetic fields. The circuits are controlled by a central processing and control unit 15 to achieve a desired pulse sequence.

The signal sensed, during the $G_R$ field application, is detected in the $H_1$ coils 4 and is amplified by an RF amplifier 16 before being applied to signal handling circuits 17. The circuits 17 are arranged to make any appropriate calibrations and corrections but essentially transmit the signals, which are effectively proton density values for strips in the body, to the processing circuits to provide the required representation of the examined slice. These circuits can be specially designed to implement the CT type of processing as described and claimed in U.S. Pat. No. 3,924,129. It is, however, advantageous to implement the processing by a suitably programmed digital computer. This computer can also conveniently control the pulse sequence and thus represents the circuits indicated at 15. The picture thus obtained is viewed on a display 18, such as a television monitor, and this may include inputs and other peripherals 19 for the provision of commands and instructions to the machine, or other forms of output.

The apparatus also includes field measurement and error signal circuits 20 which receive signals via amplifiers 21 from field probes $X_1$, $X_2$, $Y_1$, $Y_2$, N and M shown. The positions of the probes, in relation to the examined slice of the body 22 of the patient, are further shown in FIG. 2. $X_1$, $X_2$, $Y_1$ and $Y_2$ are conventional YIG (yttrium-iron-garnet) tuned oscillator field measuring probes. The probes give measures of the fields at the points at which they are situated as oscillations with frequency proportional to the field intensity. The values measured are therefore obtained by a count of the oscillations in a set time. In practice the YIG probes can oscillate in different modes and it is necessary to determine the mode in operation. For this purpose there are provided NMR probes M & N. These probes are simply miniature cells (such as a closed test tube) filled with pure or perhaps doped water and surrounded by a small coil. They give a reliable resonance of 4.26 kHz/Oe and can be used to check the YIG tuned oscillator modes. For these or other purposes NMR probes may be used exclusively provided their dimensions in the direction of the field being measured are small enough to give adequate spatial resolution. A suitable probe may be for example provided by a cylindrical water sample aligned with the z axis, with a coil disposed therearound. In one embodiment a two millimeter diameter hole fifteen millimeters long, drilled in a block of glass or a suitable water impervious plastic, such as rigid PVC or PTFE, and filled with water provides a suitable cylinder. Such a probe may advantageously be operated by measuring the phase change between the probe output and a reference frequency. Probe N, fixed in space, acts as a reference. A movable NMR probe M may be moved adjacent the YIG probes in turn to provide data to determine their modes of oscillation, orientation and other characteristics.

These probes not only indicate the values of fields obtained but can be used to provide error signals for adjustment of the fields to correct for errors and deviations from desired field values. The error signals can be determined by comparison with premeasured or calculated values stored in, for example, read-only memories (ROMs). Such an arrangement, for correcting for errors in the $H_{zo}$ field is described and claimed in co-pending application Ser. No. 048,777.

The apparatus so far described is essentially that disclosed in the said co-pending applications, and is also applicable to the apparatus of this invention.

Since the $G_R$ gradient field is to be applied at many different directions of r it has been usual to arrange this field to have a zero value at the centre of the examination plane (on the axis of the $H_{zo}$ field) and positive and negative values on opposite sides of the centre. As the field is rotated by varying the components provided by the $G_x$ and $G_y$ field coils the gradient is in effect rotated about the zero at the centre of the plane. Such rotation can readily be provided by a pair of $G_x$ coils and a pair of $G_y$ coils. In processing the signal detected for any one angle of $G_R$ there is, however, the problem that the precession frequencies have been deviated above and below the nominal frequency for the slice, as set by the values of $H_{zo}$ and $G_z$. Prior to Fourier transformation the signal is demodulated against a reference signal at the nominal frequency. The result is that two sidebands are produced and these must be separated by phase correction, prior to Fourier transformation, if signals at the same frequency, from opposite sides of the zero $G_R$ line, are to be distinguished. In certain circumstances, for example if there are variations in spin phase in the slice at the beginning of sampling, such phase correction is not possible.

It has also been noticed that NMR images processed in this manner have a tendency to artefacts at the centre of the image. It is thought that at least some of these artefacts are associated with noise in the demodulation oscillator and D.C. effects after demodulation and are therefore centred on the region corresponding to the demodulation frequency.

In this invention it is proposed to demodulate the resonance signals received against a signal at a frequency which is the Larmor frequency for a point which, for the combined fiels applied, lies outside the examined slice of the patient. If this is done a single sideband is produced. Furthermore artefacts, in the finally produced picture, which centre on the position associated with the demodulation frequency, are moved outside the useful part of the picture.

In one embodiment the zero crossing of the gradient may be maintained at the centre of the examined slice and steps taken to allow demodulation at a different frequency. In an alternative embodiment the zero crossing of the $G_r$ gradient is moved outside the examined slice of the patient, although of course maintaining it in the same plane. Demodulation is then still at the nominal frequency for the slice.

It will be understood that the gradient must still be rotated about the main field axis to provide the required data for sets of strips at different angular orientations.

In this arrangement the gradient is arranged so that, for each angular orientation of r, the zero line of $G_R$ is always tangential to a circle centred on the z-axis. The radius of that circle is set so that patients of a suitable range of body sizes can be disposed entirely within it.

Figure 3:
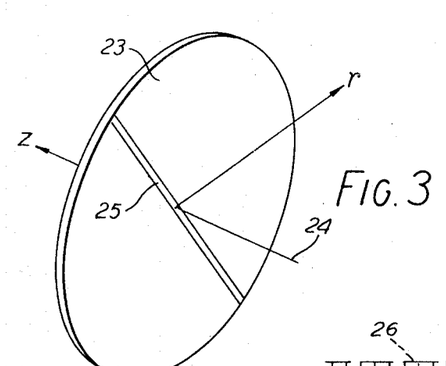
FIG. 3 shows how the gradient field is disposed in an examined slice in a prior arrangement.

FIG. 3 shows an examined slice 23 of a body. In this case and for the purposes of further description it will be assumed arbitrarily that the body is a uniform cylinder, so that the examined slices are circular discs. In practice the body will be a patient and the examined slices therefore of irregular shape. The slice is perpendicular to the main field axis 24 and the gradient field $G_R$ is in a variable direction r in the examined plane. For any direction of $G_R$, examination is for a plurality of strips perpendicular to r, of which the strip, 25, passing through axis 24 is shown. In the arrangement previously used this strip 25 is that for which the gradient field value is substantially zero and in which, therefore, the precession frequency fo is that set by the $H_z$ field value.

Figure 4A:
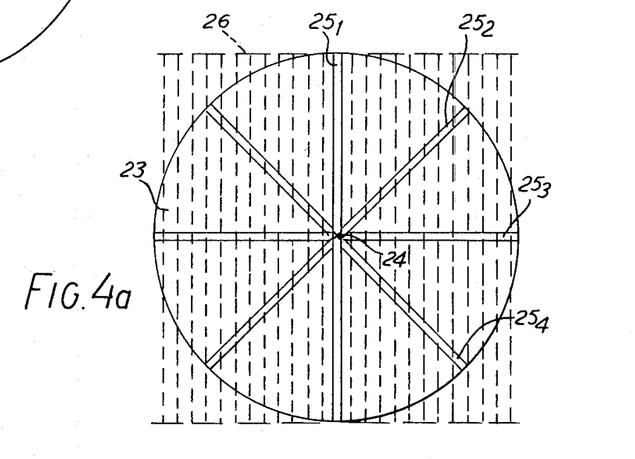
FIGS. 4a and 4b show how the gradient is disposed in different directions in the prior arrangement.

In FIG. 4a there is shown a plan view of slice 23 on which there are marked four positions, $25_1$ to $25_4$, of many assumed by strip 25 as examination is carried out for different directions of $G_R$. For position $25_1$ there are shown in broken line the other strips 26 which are examined at that $G_R$. For convenience these are shown limited by a rectangular boundary. In practice they would be limited only by the coil system used and would be of sufficient extent to include the body of the largest patient expected to be examined.

The strips either side of $25_1$ have precession frequencies above and below fo and this is illustrated by the graph of frequency against position in the slice shown in FIG. 4b. The frequency, of course, changes smoothly with the gradient field but each finite width strip is assumed to have a mean frequency uniformly therein.

Figure 4B:
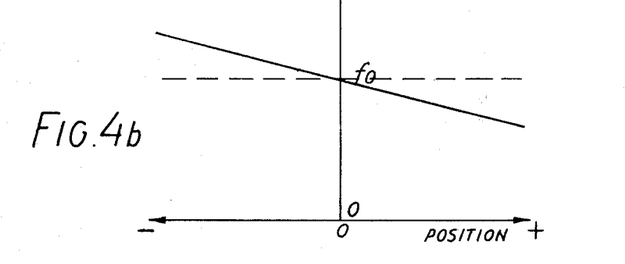

It will be seen from FIG. 4b, that if the detected signal is demodulated at fo (broken line) 'positive' and 'negative' frequencies will result and phase correction must be used to distinguish them.

Figure 5A:
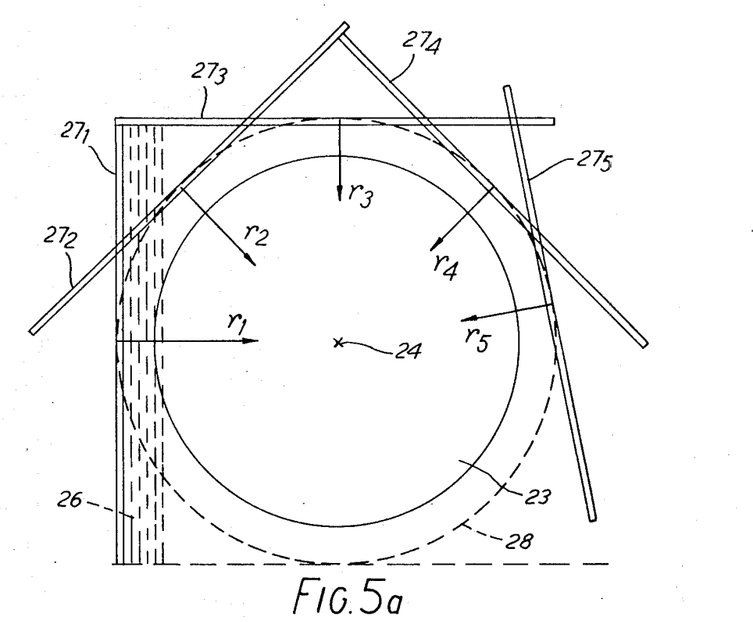
FIGS. 5a and 5b show how the gradient field is disposed in different directions in one embodiment of this invention.
Figure 5B:
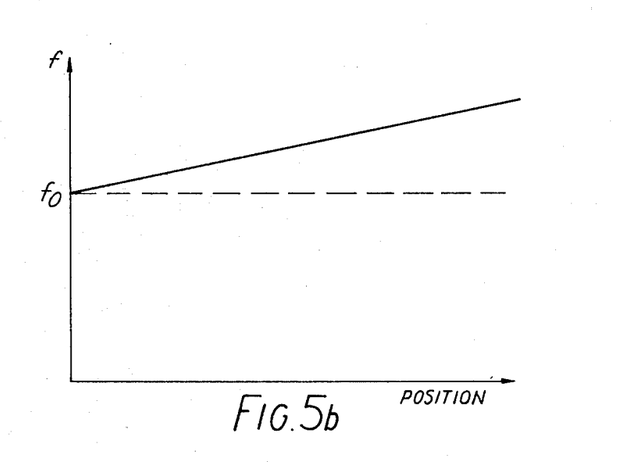

The procedure proposed in this embodiment is shown in FIG. 5a for the same slice 23. Five positions $27_1$ to $27_5$ are shown of many positions of a strip 27 which is always the same distance from axis 24, i.e. it remains tangential to a circle 28 about axis 24. The gradient field $G_R$ is arranged so that for all directions of r this strip 27 is the one for which the $G_R$ field is zero and in which the precession frequency is fo. The other strips 26, of which only a few are shown in FIG. 5a have progressively increasing frequency, in this example. FIG. 5b is, for this procedure, equivalent to FIG. 4b and shows how the precession frequency is only in one direction when demodulated by fo. Provided circle 28 is large enough to include the largest expected body artefacts associated with demodulation will be outside the useful part of the picture and additionally, for this embodiment, no phase problems arise in detection and processing.

To implement this embodiment of the invention it is required that $G_R$ always gives a zero value at strip 27 as it is rotated. To achieve this the $G_x$ coils and the $G_y$ coils are each split into opposing parts, separately excited by an individual drive amplifier. It will be understood that, by suitable choice of relative currents in the two opposing $G_x$ coil parts, the zero crossing in Gx can be displaced towards one or other of the coil parts. Similarly the zero crossing in $G_y$ can be displaced towards one or other of the $G_y$ coil parts. Thus by choosing the relative values of $G_x$ and $G_y$ not only is the direction of $G_R$ varied as before but the position of the zero crossing is controlled.

Figure 6:
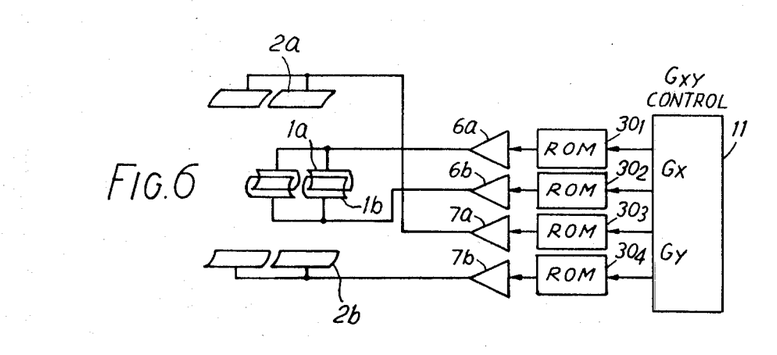
FIG. 6 shows how the gradient field drive amplifiers of FIG. 1 are arranged for one embodiment of this invention.

FIG. 6 shows that part of FIG. 1 concerned with setting of the $G_R$ gradient, modified to implement this embodiment of the invention. The X coils 1a and 1b have drive amplifiers 6a and 6b and the Y coils 2a and 2b have drive amplifiers 7a and 7b respectively. The currents required in each coil part to set up the required fields can be predetermined since, as will be understood, on each occasion of use the machine follows the identical sequence of fields, setting $G_R$ in turn at a number of required directions with the zero crossing at a required radius. The precalculated currents are stored in read only memories (ROMs) $30_1$ to $30_4$ which operate the drive amplifiers in the correct sequence when instructed by Gxy control circuits 11.

In an alternative arrangement the required fields at predetermined positions are calculated for different directions of $G_R$. The fields are then measured at these positions and the coil currents adjusted to give the desired values.

In co-pending application Ser. No. 039,649, which is concerned with adjustment of the $G_z$ field, there is disclosed an arrangement, using the field probes shown in FIG. 2, to adjust the $G_x$ and $G_y$ coil currents to bring the fields at the probes to predetermined values. It will be apparent that, if the fields at the probes are determined for this invention, such an arrangement can be adapted to give the necessary adjustment by acting separately on each coil of the two pairs.

Figure 7:
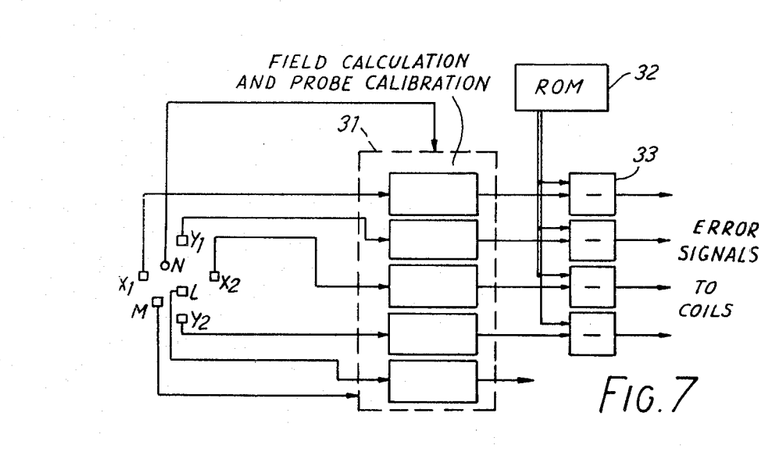
FIG. 7 shows how the field probes may be used to control the gradient field.

The arrangement is shown in simplified form in FIG. 7. The probes $X_1$, $Y_1$, $X_2$, $Y_2$ and C feed their outputs to circuits 31 which transform them to field values as described in the said application Ser. No. 039,649. Calibration is also effected in response to probes N and M. The required field values are stored in a ROM 32 and compared with the measured values in comparators 33 to give error signals for the X and Y coils. If the probes are placed so that each error can be considered to be due to incorrect currents in the nearest coil, then the error signal can be applied to the drive amplifier for that coil. The correction may need to be repeated iteratively.

In a more complex arrangement the field produced at each probe per unit current in each coil can be measured. This gives a measure of how much current in each coil is needed to adjust the field at one probe. The four error signals are then used to indicate the required current adjustments at the four coils by a process of matrix inversion as described in co-pending application Ser. No. 048,777. Matrix inversion is a procedure which can readily be carried out by a standard special purpose circuit or software package for a digital computer.

Figure 8:
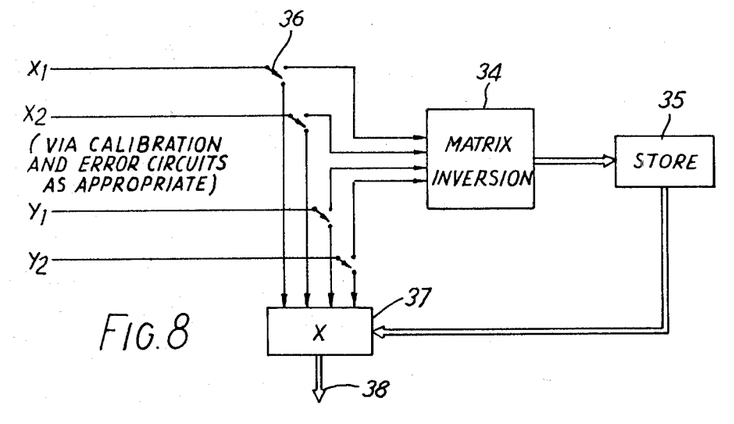
FIG. 8 shows in diagrammatic form the matrix inversion arrangement for coil current error determinations.

The arrangement is shown in diagrammatic form in FIG. 8, using in this example the outputs of the four YIG probes $X_1$, $X_2$, $Y_1$ and $Y_2$. In calibration, for unit current in each coil the outputs of the four probes are provided to matrix inversion circuits 34. These can be wired circuits or a microprocessor or other computer programmed in standard manner to provide the inversion. The inverted matrix is held in a store 35.

In operation of the apparatus, switches 36 provide the error signals from the probes (i.e. for example those from subtractors 33) to a multiplier 37, which multiplies them with the inverted matrix to give coil current error signals at 38. These are used to apply appropriate currents to the field coils to bring the probe signals to the expected values.

Figure 9:
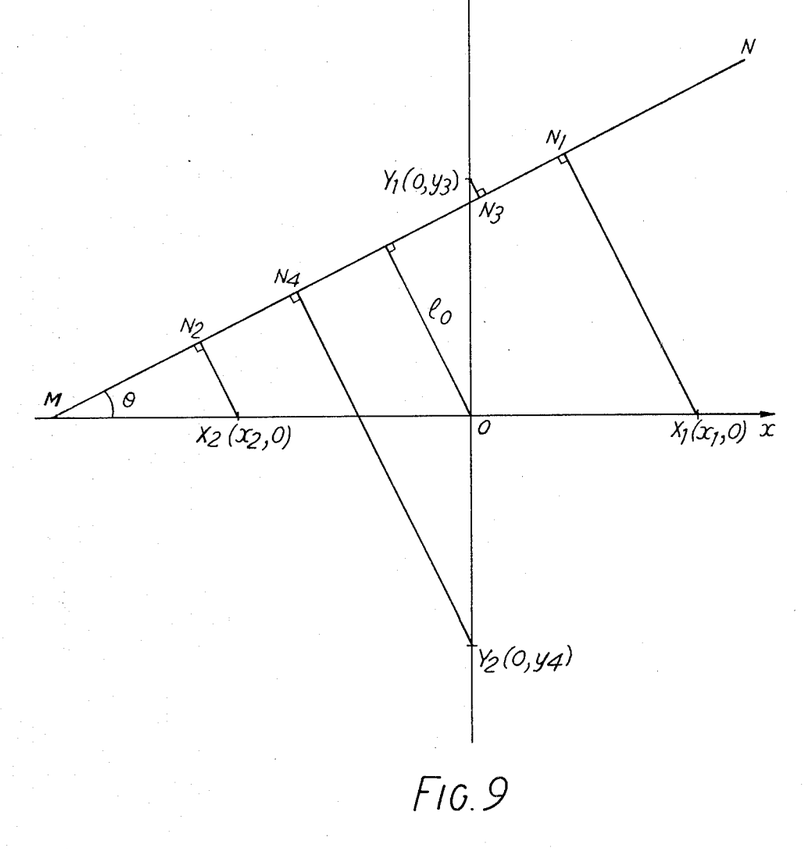
FIG. 9 shows how expected gradient field values are calculated for this invention.

The required fields (or currents) to implement the invention, may be determined experimentally. Alternatively they may be calculated. The calculation is a straightforward procedure illustrated in FIG. 9. Shown in relation to the x and y axes are the positions of the four probes in relation to the centre O. For one position of $G_R$ the gradient line is MN, tangential to a circle of radius $\rho_o$. MN is at an angle $\theta$ to the x axis. If the required field gradient perpendicular to 2N is given by $G_R = H_r/\rho$ where $H_r$ is the local field value and $\rho$ is the perpendicular distance from MN. The fields required at the four probes are then:

At $X_1$ $(x_1,o), H_1 = G_R X_1 N_1 = G_R (\rho_o + x_1 \sin \theta)$

At $X_2$ $(x_2,o), H_2 = G_R X_2 N_2 = G_R (\rho_o + x_2 \sin \theta)$

At $Y_1$ $(o,y_3), H_3 = G_R Y_1 N_3 = G_R (\rho_o - y_3 \cos \theta)$ and

At $Y_2$ $(o,y_4), H_4 = G_R Y_2 N_4 = G_R (\rho_o - y_4 \cos \theta)$

These formula will give correct signs of fields bearing in mind that $x_2$ and $y_4$ are negative for the geometry shown. Thus $H_3$ will have a negative value for the position of MN shown, the other fields being positive. It must be remembered that these values are superimposed on other fields applied to give the values actually measured.

Although this embodiment of the invention places the zero crossing of $G_R$ outside the examined region, it may not always be advantageous to do this. To some extent the field gradient provided by pairs of coils tends to be more uniform near the zero-crossing. Furthermore difficulties, such as aliasing problems, can occur at crests of gradient near the coils. For this reason, if maximum accuracy of examination is required in a limited region of the body it may be advantageous to place the zero-crossing in that limited region and to maintain it in a substantially fixed position as $G_R$ is rotated. In that case, of course, the problems of double sidebands are still present. However in most circumstances this embodiment of the present invention can satisfactorily be applied with consequent saving in processing.

It has been mentioned hereinbefore that as an alternative to moving the zero crossing of the $G_R$ gradient outside the body, it may be maintained within, generally at the centre of, the slice. Demodulation then takes place at a frequency which, taking into account the $G_R$ gradient being applied as well as the field and $G_z$ gradient, is the Larmor frequency for a point outside the slice, although in the same plane.

Demodulation at a frequency which does not correspond to the centre crossing is not generally a straightforward procedure of merely changing the reference frequency since other requirements of the NMR scanning procedure often conflict. For example in a practical apparatus the $G_R$ gradient is not applied as a square or rectangular pulse but has a more rounded shape, perhaps a distorted sinusoid, which can straightforwardly be achieved. In order to achieve proper sampling of the NMR signal when such a rounded gradient pulse is used it is desirable not to sample at equal intervals of time during the $G_R$ pulse but to sample at equal steps of field integral. This procedure is the subject of our co-pending patent application Ser. No. 039,650. This sampling procedure will render incorrect results if the reference frequency is simply changed to correspond to an out-of-slice point.

A correction procedure has therefore been devised which allows the demodulation frequency to be changed while still giving correct samples. This procedure will be explained with reference to FIG. 10 which corresponds to FIG. 4b in showing the precession frequencies for the slice plane as a function of position in the plane from the centre with the 'nominal' slice frequency $f_o$, by which the detected signal has herebefore been expected to be demodulated, at the centre. A typical strip, in the plane, perpendicular to the $G_R$ gradient is assumed to resonate at frequency $f_r$ which varies with position r.

Figure 10:
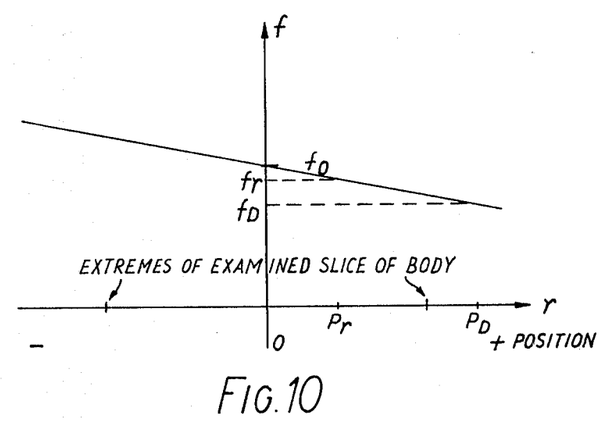
FIG. 10 is used to show the significance of another embodiment of this invention and FIG. 11 is a block diagram of a circuit for operating the embodiment discussed with reference to FIG. 10.

In accordance with the invention the resonance signal is to be demodulated at a frequency $f_D$ which is the precession frequency for a position outside the extremes of the Examined slice. Frequency $f_D$ cannot in this example be equal to $f_o$ which lies within the body slice.

Following the desired procedure the resonance signals are sampled using the non linear (or 'stretch-time') procedure described in application Ser. No. 039,650 during the $G_R$ gradient pulse. This gives in the normal manner an output of all frequencies $(f_o + f_r)$ which could be demodulated at $f_o$ to give frequencies $f_r$. However it is in this example demodulated at $f_D$ to give $(f_o + f_r = f_D)$ where $f_D < (f_o + f_r)$ min. These demodulated frequencies are then stored.

The sampling procedure is then repeated without the $G_R$ field gradient but using the same sampling intervals used and predetermined for the gradient pulse used initially. This then gives samples of $f_o$ instead of $f_o + f_r$ since in the absence of the $G_R$ gradient there is no radial phase dispersion.

The $f_o$ signals are also demodulated at $f_D$ to give samples of $f_o - f_D$. Finally for each $(f_o + f_r - f_D)$ the complex product is taken of that signal with $(f_o - f_D)$ to give $(f_o + f_r - f_D) - (f_o - f_D) = f_r$. This is equivalent to demodulation of $f_o + f_r - f_D$ at $f_o - f_D$ to give the required $f_r$. The $f_r$ values obtained are the same as those which would have been obtained by demodulating at $f_o$ but the procedure has avoided some problems associated with such demodulation, including the problem of demodulation oscillator noise. It will be understood that this effective demodulation has in effect moved the demodulation point back to the centre of the slice so that although noise artefacts are reduced, in this embodiment the double sidebands have been reconstituted. If that problem is found to be important the preceding embodiment may be preferred. As before, this procedure is repeated for different directions of r, so that the demodulation point moves around the body of the patient, and the signals are analysed by reconstruction techniques to give the desired picture.

Figure 11:
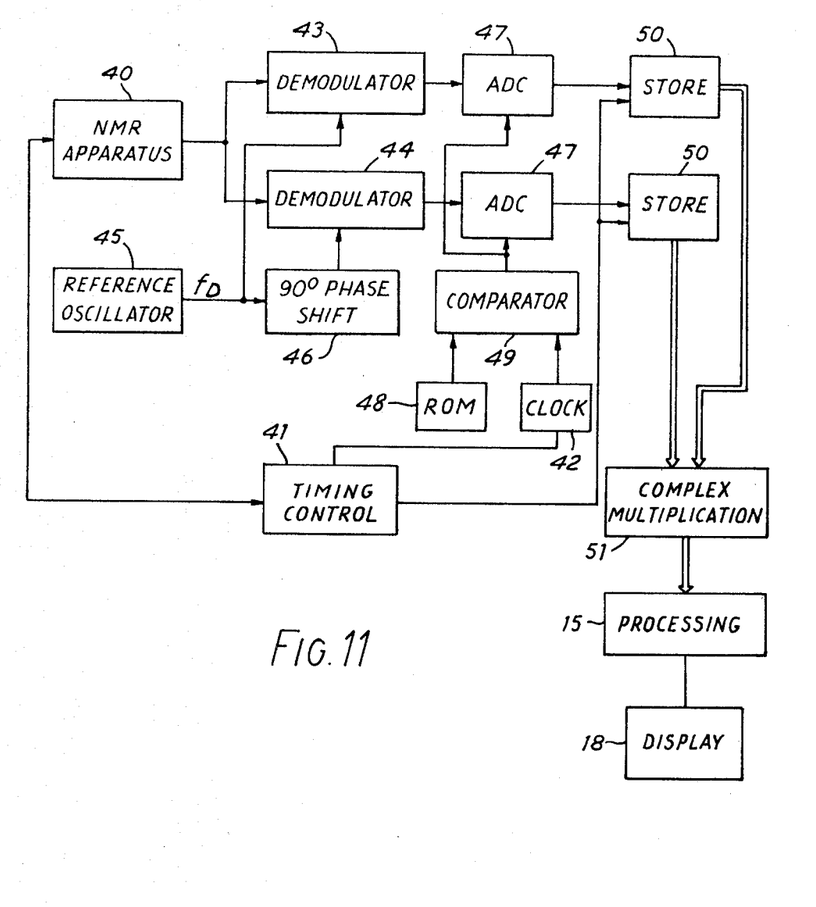

A block diagrammatic circuit for implementing this procedure is shown in FIG. 11. The NMR apparatus, which may be as shown in FIG. 1, is indicated at 40. At 41, there is shown a timing control unit which cooperates with the NMR apparatus and serves to control the timing of the various operations. It will be appreciated that the operation follows a well defined and predetermined sequence. The times for particular operations are therefore held in stores incorporated in unit 41 and in response to signals from a system clock 42 timing signals are transmitted to the respective parts of the system. In practice this as with many other units, may be incorporated in a digital processor which can control the operation as well as processing the final signals.

The NMR apparatus 40 is first caused to operate with a $G_R$ gradient in the manner previously disclosed and the resonance signals thus provided are demodulated in demodulators 43 and 44 at frequency $f_D$ from a reference oscillator 45. To preserve phase information demodulation is into in-phase and quadrature components, the reference for demodulator 44 being shifted by 90° in circuits 46.

The demodulated $(f_o+f_r-f_d)$ signals are digitised in Analogue to Digital converters (ADC's) 47. The sampling is achieved at this stage, the sampling intervals being unequal as mentioned hereinbefore. This is accomplished by holding the desired sampling times in a ROM (read only memory) 48 the output of which is compared at 49 with a count of pulses from the clock 42 until precalculated counts are reached. Alternatively the field can be sampled by the field probe system and samples taken when a predetermined field integral is reached.

It will be appreciated that this procedure of sampling after demodulation is an alternative to the reverse procedure described hereinbefore. The samples obtained are stored, still for in-phase (I) and quadrature (Q) components in stores 50.

When the sampling is completed control 41 causes the NMR apparatus to remove the $G_R$ field gradient and repeat this procedure, this time obtaining I and Q samples of $f_o+f_r$ which can be called I' and Q'. Finally stores 50 are caused to provided I and I' and Q and Q' signals for the same strips together to circuits 51 where they are complex multiplied to give $f_r$ signals for Fourier transform and further processing in 15. The complex multiplication is a straightforward procedure giving real parts $I \times I' + Q \times Q'$ and imaginary parts $I \times Q' + I' \times Q$.

It will be appreciated that other circuits and procedures for implementing the invention may readily be devised.

What we claim is:

1. A nuclear magnetic resonance apparatus, for examining a substantially planar slice of a body, the apparatus including means for applying magnetic fields to cause resonance preferentially in the plane of said slice, means for applying a pulsed magnetic field having a gradient across the plane of the slice to produce phase dispersion in said resonance, means for sensing resonance signals induced during said pulsed field for a plurality of different directions thereof, means for demodulating the resonance signals and means for further processing the demodulated signals to provide a representation of said slice, wherein the resonance signals are demodulated at a frequency which, in the presence of the said magnetic fields and pulsed magnetic field, is the resonance frequency for a position in the plane lying outside said slice.

2. An apparatus according to claim 1 in which the means for applying the pulsed field is arranged so that said field has a gradient with a zero crossing at the centre of the slice and the means for demodulating is arranged to demodulate at a frequency which is the resonance frequency for a position in the plane lying outside said slice in the presence of said gradient.

3. An apparatus according to claim 2 including means for effectively further demodulating the first demodulated signals to provide signals representing the change of frequency produced by the gradient.

4. An apparatus according to claim 3 including means for repeating the sensing of the resonance signals in the presence of the magnetic fields but not the pulsed gradient field and means for effectively demodulating said first sensed resonance signals at the frequency of said second sensed resonance signals.

5. An apparatus according to claim 4 in which the first and second sensed resonance signals are multiplied in complex manner to achieve said effective demodulation.

6. An apparatus according to claim 1 in which the pulsed field has a zero crossing in the plane lying outside said slice and the demodulation frequency is the resonance frequency for the plane in the absence of said pulsed field.

7. A nuclear magnetic resonance apparatus, for examining a substantially planar slice of a body, the apparatus including means for applying magnetic fields to cause resonance preferentially in the plane of said slice, means for applying a pulsed magnetic field having a gradient across the plane of the slice to produce phase dispersion in said resonance and repeating the pulsed magnetic field for a plurality of different directions of said gradient in sequence, and means for sensing a resonance signal induced during said pulsed field for each of said directions thereof wherein the means for applying the pulsed field is arranged so that said pulsed field is only of one polarity within said slice.

8. A nuclear magnetic resonance apparatus, for examining a substantially planar slice of a body, the apparatus including means for applying magnetic fields to cause resonance preferentially in the plane of said slice, means for applying a pulsed magnetic field having a gradient across the plane of the slice in each of a plurality of different directions at different times, to produce phase dispersion in said resonance, and means for sensing a resonance signal induced during said pulsed field for each of said plurality of different directions thereof, wherein the means for applying the pulsed field is arranged so that the pulse field has a zero value along a straight line which is in the place of said slice and which, for said different directions of said gradient, is tangential to a circle surrounding the body.

9. An apparatus according to either claim 7 or claim 8 in which the means for applying the pulsed magnetic field include two coil arrangements disposed to provide component fields having orthogonal gradients and control means arranged to control the proportions of said component fields to vary the direction of said first-mentioned gradient and wherein each coil arrangement is split into opposing parts and the control means are also arranged to control the proportion of each field provided by the respective parts to vary the position of the zero value of the respective component fields.

10. An apparatus according to claim 9 in which the control means are adapted to produce predetermined currents in each coil part in sequence.

11. A nuclear magnetic resonance apparatus for examining a substantially planar slice of a body, the apparatus including means for applying magnetic fields to cause resonance preferentially in the plane of said slice, means for applying a pulsed magnetic field having a gradient across the plane of the slice to produce phase dispersion in said resonance and repeating the pulsed magnetic field for a plurality of different directions of said gradient at different times, the means for applying the pulsed field being arranged so that the pulsed field is only of one polarity within the slice, means for sensing a resonance signal induced during said pulsed field for each of said directions, probe means to measure the magnetic fields at different positions in the region of the slice and means for determining the differences between the measured fields and for controlling the means for applying the pulsed magnetic field to reduce said differences.

12. An apparatus according to claim 11 in which correcting currents in coils producing the magnetic fields are provided by multiplying the field differences by an inverted matrix of fields produced by unit current in each of said coils.

13. A method of examining a substantially planar slice of a body by nuclear magnetic resonance, the method including: applying magnetic fields to cause resonance preferentially in the plane of the slice; applying a pulsed magnetic field having a gradient across the plane of the slice to produce phase dispersion in said resonance; sensing the resonance signals induced during said pulsed field for a plurality of different directions thereof; demodulating the resonance signals and further processing the demodulated signals to provide a representation of said slice; wherein the resonance signals are demodulated at a frequency which, in the presence of the said magnetic fields and pulsed magnetic field, is the resonance frequency for a position in the plane lying outside said slice.

14. A method according to claim 13 in which the pulsed field has a gradient with a zero crossing at the centre of the slice and the demodulation frequency is the resonance frequency for a position in the plane lying outside said slice in the presence of said gradient.

15. A method according to claim 14 in which the first demodulated signals are further demodulated to provide signals representing the change of frequency produced by the gradient.

16. A method according to claim 15 including repeating the sensing of the resonance signals, in the presence of the magnetic fields but not the pulsed gradient field, and effectively demodulating said first obtained resonance signals at the frequency of said second sensed resonance signals.

17. A method according to claim 16 in which the first and second sensed resonance signals are multiplied in complex manner to achieve said effective demodulation.

18. A method according to claim 13 in which the pulsed field has a zero crossing in the plane but lying outside said slice and the demodulation frequency is the resonance frequency for the plane in the absence of said pulsed field.

19. A method according to claim 18 in which, for said plurality of directions of said gradient, the zero-crossing of said gradient is arranged to be along a straight line, in the plane of the slice, tangential to a circle surrounding the body.

20. A method of examining a substantially planar slice of a body by nuclear magnetic resonance, the method including applying magnetic fields to cause resonance preferentially in the plane of the slice, applying a pulsed magnetic field having a gradient across the plane of the slice to cause phase dispersion in said resonance, sensing the resonance signals produced thereby and repeating the procedure for a plurality of different directions of said gradient in sequence, wherein the pulsed field is arranged to have a zero value which lies in said plane but outside said slice.

21. A method of examining a substantially planar slice of a body by nuclear magnetic resonance, the method including applying magnetic fields to cause resonance preferentially in the plane of the slice, applying a pulsed magnetic field, having a gradient across the plane of said slice and a zero value which is in said plane but outside said slice, to cause phase dispersion in said resonance, sensing the resonance signals, produced thereby and repeating the procedure for each of a plurality of different directions of said gradient, wherein the zero-value of said pulsed field is arranged to be along a straight line which is in the plane of the slice and which, for said different directions of said gradient, is tangential to a circle surrounding the body.

22. A method according to either claim 20 or claim 21 in which the currents in coils producing said pulsed field are predetermined and are applied in a predetermined sequence.

23. A method according to either claim 20 or 21 in which the field values at a plurality of points in the region of the body are predetermined for the different directions of said gradient, the actual fields achieved at those points are measured and the means for producing the fields are adjusted to reduce differences between the predetermined and measured fields.

24. A method of examining a substantially planar slice of a body by nuclear magnetic resonance, the method including: applying magnetic fields to cause resonance preferentially in the plane of the slice; applying a pulsed magnetic field having a gradient across the plane of the slice with a zero crossing within the slice to produce phase dispersion in said resonance; sensing the resonance signals induced during said pulsed field; demodulating the resonance signals at a frequency which, in the presence of said magnetic fields and pulsed magnetic field, is the resonance frequency for a position in the plane lying outside said slice; repeating the sensing of the resonance signals in the presence of the first mentioned magnetic fields but not the pulsed gradient field; effectively demodulating said first obtained resonance signals at the frequency of said second sensed signals; repeating the preceding steps for a plurality of different directions of said gradient and further processing the demodulated signal for said different directions to provide a representation of said slice.

* * * * *